(12) United States Patent
Masuda et al.

(10) Patent No.: US 6,737,714 B2
(45) Date of Patent: May 18, 2004

(54) FET HAVING A GATE ELECTRODE OF A HONEYCOMB STRUCTURE

(75) Inventors: Hiroo Masuda, Tokyo (JP); Kazuyoshi Hara, Tokyo (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 10/347,838

(22) Filed: Jan. 17, 2003

(65) Prior Publication Data

US 2003/0136984 A1 Jul. 24, 2003

(30) Foreign Application Priority Data

Jan. 21, 2002 (JP) ........................................ 2002-011989

(51) Int. Cl.[7] .................... H01L 29/76; H01L 29/94; H01L 31/062; H01L 31/113; H01L 31/119
(52) U.S. Cl. ........................................ 257/401; 257/390
(58) Field of Search ................................. 257/390, 401

(56) References Cited

U.S. PATENT DOCUMENTS

| 5,635,742 | A | * | 6/1997 | Hoshi et al. | 257/337 |
| 5,838,050 | A | * | 11/1998 | Ker et al. | 257/401 |
| 5,852,315 | A | * | 12/1998 | Ker et al. | 257/355 |
| 6,320,223 | B1 | * | 11/2001 | Hueting et al. | 257/341 |

OTHER PUBLICATIONS

Matsuzawa, Akira, "A Potential of CMOS as an Ultra–High Speed and High Frequency LSI," *Technical Report of IEICE ED* 97–50:69–76, Jun. 1997.

Van den Bosch, A., et al., "A High–Density, Matched Hexagonal Transistor Structure in Standard CMOS Technology for High–Speed Applications," *IEEE Transactions on Semiconductor Manufacturing* 13 (2):167–172, May 2000.

* cited by examiner

*Primary Examiner*—Ngân V. Ngô
(74) *Attorney, Agent, or Firm*—Christensen O'Connor Johnson Kindness PLLC

(57) ABSTRACT

There is provided a semiconductor device comprising a gate electrode which is formed on a semiconductor substrate through a gate insulating film and in which a plurality hexagonal rings are mutually connected so as to form a honeycomb structure, drain diffusion layers each formed in the semiconductor substrate on the inside of one hexagonal ring, source diffusion layers formed in the semiconductor substrate on the inside of a plurality of hexagonal rings which are adjacent to the hexagonal ring having the drain diffusion layer formed therein, and, insulating layers formed between respective source diffusion layers in the semiconductor substrate.

6 Claims, 5 Drawing Sheets

FET HAVING A GATE ELECTRODE OF A HONEYCOMB STRUCTURE

CROSS-REFERENCE TO RELATED APPLICATIONS

This application is based upon and claims the benefit of priority from the prior Japanese Patent Application No. 2002-011989, filed Jan. 21, 2002, the entire contents of which are incorporated herein by reference.

BACKGROUND OF THE INVENTION

1. Field of the Invention

The present invention relates to a semiconductor device including a FET having a gate electrode of a honeycomb structure.

2. Description of the Related Art

A FET having a gate electrode of a honeycomb structure has been considered for use as a high frequency element.

A MOSFET of a honeycomb structure has been disclosed, as in IEEE Trans. on Semiconductor Manufacturing, Vol. 13, pp. 167–172, May 2000, for example. The literature is a report about a MOSFET of hexagonal honeycomb structure. In the literature, it is described that a highly integrated (small area) circuit can be provided particularly by a 2-input drain/source common circuit configuration (FIG. 3, FIG. 6). The structure of a conventional MOSFET of honeycomb structure is shown in FIG. 1.

In the structure shown in the literature, elongated hexagonal gate electrodes are sequentially connected from upper left to lower right. In such a structure, a gate resistance becomes larger, and high frequency characteristics are deteriorated. Further, since a drain diffusion layer contact is obliquely arranged at 45°, and a source electrode wiring is configured with an oblique wiring at 60°, it is predicted that the oblique wiring rule would become highly complicated, resulting in a lower semiconductor device yield.

A conventional FET having a gate electrode of a honeycomb structure has a problem that the wiring design rule of the drain wiring layer and the source wiring layer becomes complicated.

BRIEF SUMMARY OF THE INVENTION

It is an object of the present invention to provide a semiconductor device capable of simplifying a design rule of drain wiring layers in a convention FET having a gate electrode of a honeycomb structure, as described above.

In order to achieve the above object, according to one aspect of the present invention, there is provided a semiconductor device comprising:

a plurality of unit cells, each comprising a gate insulating film formed on a semiconductor substrate, a gate electrode formed on the gate insulating film and in which a plurality of hexagonal rings are mutually connected so as to form a honeycomb structure, a drain diffusion layer formed in the semiconductor substrate on the inside of one hexagonal ring, and source diffusion layers formed in the semiconductor substrate on the inside of a plurality of hexagonal rings which are adjacent to the hexagonal ring having the drain diffusion layer formed therein;

source contact plugs formed in the semiconductor substrate and are electrically connected to source diffusion layers;

a source wiring layer formed on the semiconductor substrate and is connected to the source contact plugs;

drain contact plugs formed on the semiconductor substrate and are electrically connected to drain diffusion layers; and a drain wiring layer formed on the semiconductor substrate and being electrically connected to the drain contact plugs, wherein each unit cell being arranged sharing source diffusion layers in adjacent unit cells, the hexagonal rings each having two vertexes having an inner angle 90°, and four vertexes having an inner angle 135°, the hexagonal rings each being symmetrical with respect to a segment connecting the two vertexes having an inner angle 90°, and the drain wiring layer is configured in which a plurality of isosceles triangle rings, where a hypotenuse is parallel to the segment, are mutually connected so as to form a honeycomb structure.

According to another aspect of the present invention, there is provided a semiconductor device comprising:

a plurality of unit cells each comprising a gate insulating film formed on a semiconductor substrate, a gate electrode formed on the gate insulating film and in which a plurality of hexagonal rings are mutually connected so as to form a honeycomb structure, a drain diffusion layer formed in the semiconductor substrate on the inside of one hexagonal ring, and source diffusion layers formed in the semiconductor substrate on the inside of a plurality of hexagonal rings which are adjacent to the hexagonal ring having the drain diffusion layer formed therein;

source contact plugs formed in the semiconductor substrate and are electrically connected to source diffusion layers;

a source wiring layer formed on the semiconductor substrate and is connected to the source contact plugs;

drain contact plugs formed on the semiconductor substrate and are electrically connected to drain diffusion layers; and a drain wiring layer formed on the semiconductor substrate and is electrically connected to the drain contact plugs, wherein each unit cell being arranged sharing source diffusion layers in adjacent unit cells, the hexagonal ring being equilateral hexagonal, and the drain wiring layer being configured in which a plurality of isosceles triangles are mutually connected so as to form a honeycomb structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments according to the present invention will be described below with reference to the drawings.
(First Embodiment)

Figure 1A:
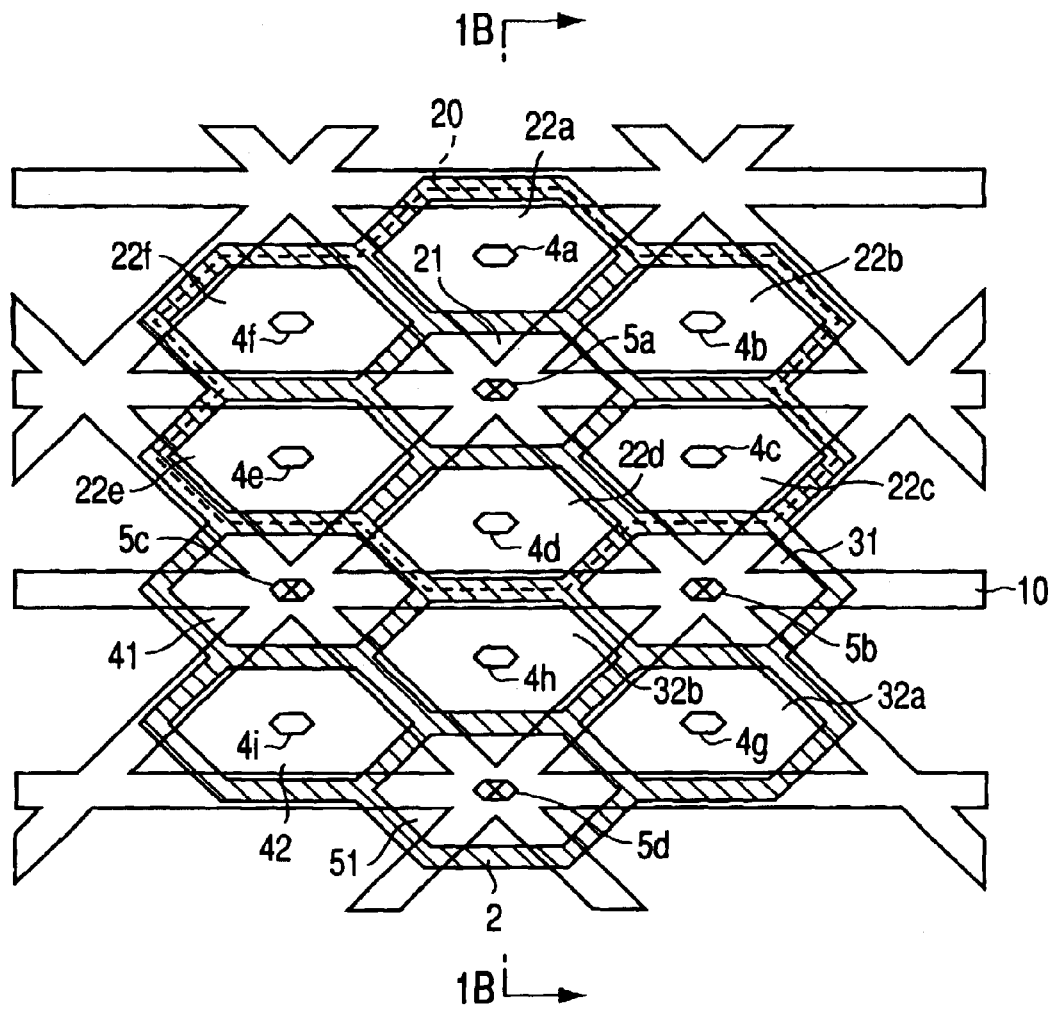
FIGS. 1A and 1B are views showing a schematic configuration of a semiconductor device according to a first embodiment of the present invention.
Figure 1B:
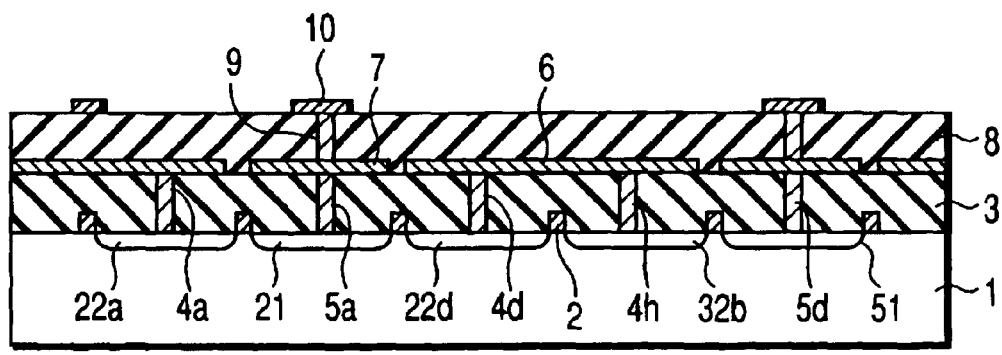

FIGS. 1A and 1B are diagrams showing a schematic configuration of a semiconductor device according to a first embodiment of the present invention. FIG. 1A is a plan view, and FIG. 1B is a sectional view taken along the line 1B–1B' of FIG. 1A.

Figure 2:
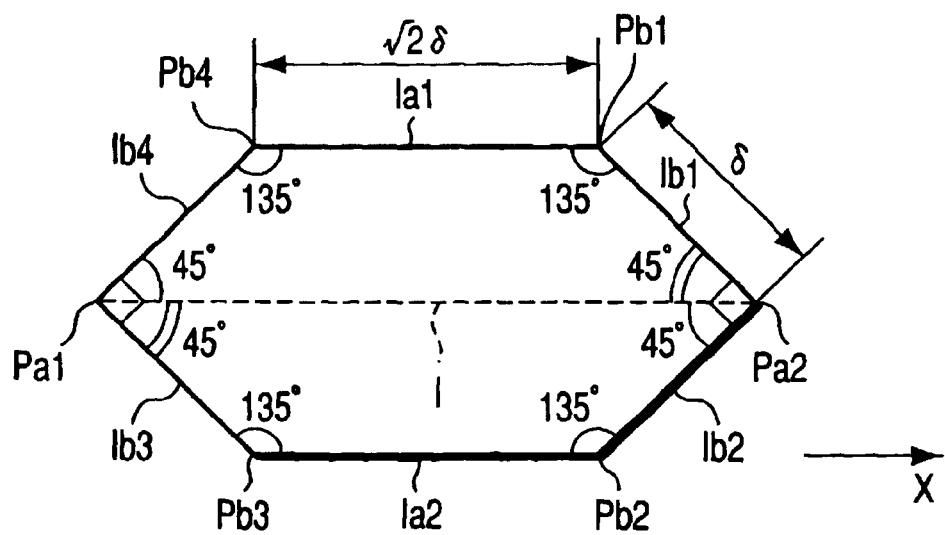
FIG. 2 is a plan view showing a configuration of hexagonal rings constructing a gate electrode of the semiconductor device according to the first embodiment.

As shown in FIGS. 1A and 1B, a gate electrode 2 is formed on a semiconductor substrate 1 through a gate insulating film (not shown) in which a plurality of hexagonal rings are mutually connected so as to form a honeycomb structure. A configuration of the hexagonal rings will be described with reference to FIG. 2. FIG. 2 is a plan view showing the configuration of hexagonal rings constructing the gate electrode.

As shown in FIG. 2, the hexagonal rings constructing the gate electrode each have vertexes $P_{a1}$, $P_{a2}$, and vertexes $P_{b1}$ to $P_{b4}$. The inner angle of each of the vertexes $P_{a1}$, $P_{a2}$ is 90°. The inner angle of each of the vertexes $P_{b1}$ to $P_{b4}$ is 135°. The hexagonal ring is configured with a symmetric diagram with respect to a segment l connecting the vertex $P_{a1}$ and the vertex $P_{a2}$.

In other words, the hexagonal ring is configured with two sides $l_{a1}$ and $l_{a2}$ which are parallel to the horizontal (hereinafter referred to as the x direction), and four sides $l_{b1}$ to $l_{b4}$ parallel to a direction inclined 45° towards the x direction. The lengths of the two sides $l_{a1}$ and $l_{a2}$ are each $\sqrt{2}\delta$. Further, the lengths of the four sides $l_{b1}$ to $l_{b4}$ are each $\delta$.

A first drain diffusion layer 21 is formed in the semiconductor substrate 1 on the inside of one hexagonal ring constructing the gate electrode. Source diffusion layers 22a to 22f are formed in the semiconductor substrate 1 on the inside of the hexagonal rings around the wiring where the first drain diffusion layer 21 is formed.

The above configuration is a first unit cell 20 constructing one unit cell.

A second unit cell which is adjacent to the first unit cell 20 and shares the first source diffusion layers 22c and 22d is formed. The second unit cell comprises a second drain diffusion layer 31 formed in the semiconductor substrate 1 on the inside of one hexagonal ring. Further, source diffusion layers 32a and 32b are formed in the semiconductor substrate 1 on the inside of the hexagonal rings around the wiring where the second drain diffusion layer 31 is formed.

A third unit cell which is adjacent to the first and second unit cells and shares the first and second source diffusion layers 22d and 22e is formed. The third unit cell comprises a third drain diffusion layer 41 formed in the semiconductor substrate 1 on the inside of one hexagonal ring. In addition, a third source diffusion layer 42 is formed in the semiconductor substrate 1 on the inside of the hexagonal ring around the wiring where the third drain diffusion layer 41 is formed.

A fourth unit cell which is adjacent to the second and third unit cells and shares the second and third source diffusion layers is formed. The fourth unit cell comprises a fourth drain diffusion layer 51 formed in the semiconductor substrate 1 on the inside of one hexagonal ring.

A first interlayer insulating film 3 covering the gate electrode 2 is formed on the semiconductor substrate 1. Source contact plugs 4 are formed in source contact holes which are formed in the first interlayer insulating film 3 and are connected to the source diffusion layers 11, 22, and 32. Drain contact plugs 5 are formed in drain contact holes which are formed in the first interlayer insulating film 3 and are connected to the drain diffusion layers 21, 31, 41, and 51.

Figure 3:
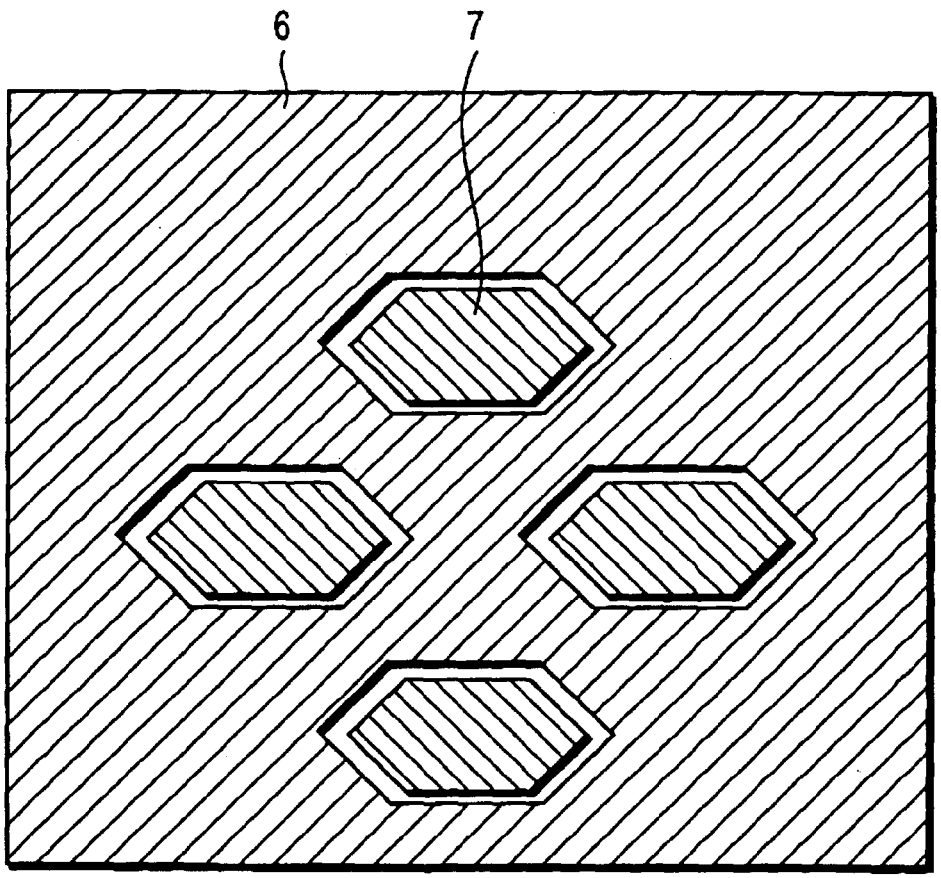
FIG. 3 is a plan view showing a configuration of a source wiring layer of the semiconductor device according to the first embodiment.

A source wiring layer 6 is formed on the first interlayer insulating film 3 and the source contact plugs 4. As shown in FIG. 3, the source wiring layer 6 is formed over substantially the entire surface of the first interlayer insulating film and covers the entire gate electrode 2. Drain intermediate wiring layers 7 which are not connected to the source wiring layer 6 are formed on the first interlayer insulating film 3 and the drain contact plugs 5. FIG. 3 is a plan view showing a configuration of the source wiring layer of the semiconductor device according to the first embodiment.

A second interlayer insulating film 8 which covers the source wiring layer 6 and the drain intermediate wiring layers 7 is formed on the first interlayer insulating film 3. Drain via plugs 9 are formed in drain via holes which are formed in the second interlayer insulating film 8 and are connected to the drain intermediate wiring layers 7. A drain wiring layer 10 is formed on the second interlayer insulating film 8 and the drain via plugs 9.

Figure 4:
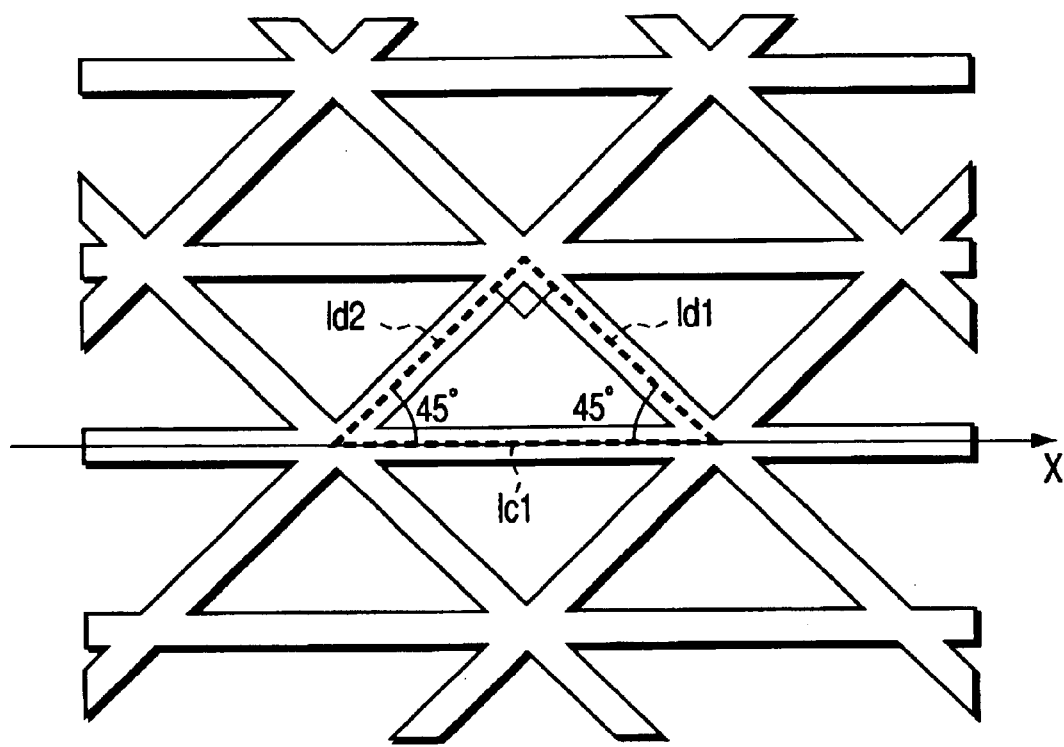
FIG. 4 is a plan view showing a configuration of a drain wiring layer of the semiconductor device according to the first embodiment.

In the drain wiring layer 10, a plurality of rectangular equilateral triangle rings are mutually connected so as to form a honeycomb structure as shown in FIG. 4. Each rectangular equilateral triangle ring has a side $l_{c1}$ which is parallel to the x direction and has a length 3 $\sqrt{2}\delta$, and two sides $l_{d1}$ and $l_{d2}$ which are each parallel to a direction inclined 45° towards the x direction and each have a length 3δ. The side $l_{c1}$ is the hypotenuse of the rectangular equilateral triangle ring. FIG. 4 is a plan view showing a configuration of the drain wiring layer of the semiconductor device according to the first embodiment.

The wirings constructing the gate electrode and the drain wiring layer are only in the x direction or the direction inclined 45° towards the x direction. Therefore, when the gate electrode and the drain wiring layer are designed, a design rule of oblique wiring is simplified so that designing is facilitated.

In the honeycomb gate structure, a current gain per unit area can be increased as compared with a conventional comb type gate structure so that a large drain current flows. Therefore, it is important to effectively reduce a source resistance in the source wiring layer which causes deterioration of transistor performance. The layout of the source wiring layer shown in FIG. 3 is a layout where the source resistance is smallest.

There is the advantage that the gate electrode is fully covered with the source wiring layer so that the drain wiring layer (output) and the gate electrode (input) can be shielded in an electrostatic capacitance manner. Thereby, it is possible to minimize an input/output feedback signal so that high frequency characteristics can be improved.

The capacitance between the drain wiring layer and the gate electrode acts as a mirror capacitance, that is an input/output feedback (negative feedback) capacitance in a circuit manner. This capacitance causes deterioration of high speed/high frequency characteristics. As shown in FIG. 3, the source wiring layer is arranged between the drain wiring layer and the gate electrode. The source wiring layer 6 is arranged at this position, and eliminates the mirror capacitance between the drain wiring layer and the gate electrode, and is effective in greatly improving the high speed/high frequency characteristics of the honeycomb gate structure.

The drain diffusion layers are configured to be fully surrounded by the gate electrode so that the source diffusion layers surround the outside of the gate electrode. Therefore, the area of the drain diffusion layers can be reduced, that is the drain output capacitance can be reduced so that a semiconductor device with excellent high speed/high frequency characteristics can be provided.

Next, there are shown calculation results of a gate length $L_g$, a source diffusion layer area $A_d$, and a drain diffusion layer area As per unit cell in the semiconductor device shown in FIG. 1.

$$L_g = (4 + \sqrt{2})\delta$$

$$A_d = \left(6 - \frac{1+\sqrt{2}}{2}\right)\delta^2 = 1.793\delta^2$$

$$A_s = \left(6 - \frac{1+\sqrt{2}}{2}\right)\delta^2 = 2.586^2$$

Figure 5:
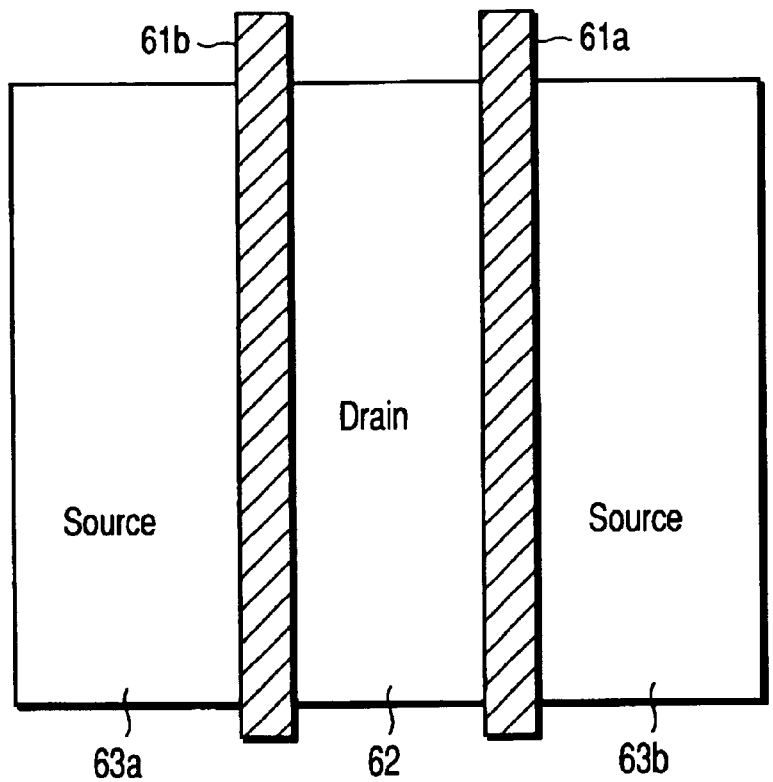
FIG. 5 is a view showing a conventional FET.

There will next be described a FET in which gate electrodes are formed at both sides of one conventional drain region and which has source diffusion layers formed sandwiching each gate electrode with the drain region. A structure of the conventional FET is shown in FIG. 5. The following calculations are conducted so that the gate lengths are equal between the FET shown in FIG. 1 and the FET shown in FIG. 5.

There are shown calculation results of a gate length $L'_g$, a source diffusion layer area $A'_d$, and a drain diffusion layer area $A'_s$ per unit cell of the conventional FET.

$$L'_g = (4+\sqrt{2})\delta$$

$$A'_d = 3(1+\sqrt{2})\delta^2 = 7.242^2$$

$$A'_s = \frac{3(1+\sqrt{2})}{2}\delta^2 = 3.6218^2$$

When both are compared, it can be seen that the semiconductor device according to the present embodiment is 50% smaller in the drain diffusion layer area and 36% smaller in the source diffusion layer area. In other words, it is clear that a semiconductor device with a higher performance and higher speed than the conventional one can be realized according to the present invention.

A honeycomb gate structure with the highest performance is a layout structure which forms the smallest honeycomb in a given layout rule. Here, approximating with a circular layout helps to understand it.

For a circular gate having a radius r, the drain diffusion layer area $A''_d$ is $(4/3)\pi r^2$, and the gate width is $2\pi r$. The response time constant $\tau$ is proportional to $A''_d/W$, so that the response time constant $\tau$ is proportional to the radius r. Therefore, the smaller the radius r is, the better the response characteristics of the transistor become. Accordingly, the structure having the best characteristics is one in which utilizes the smallest circular gate transistor possible in the layout rule. Similarly, also in the case of the honeycomb hexagonal gate, it is possible to easily analogize that the smallest honeycomb hexagonal gate structure allowed in the layout rule is the structure with the best transistor characteristics.

(Second Embodiment)

Figure 6A:
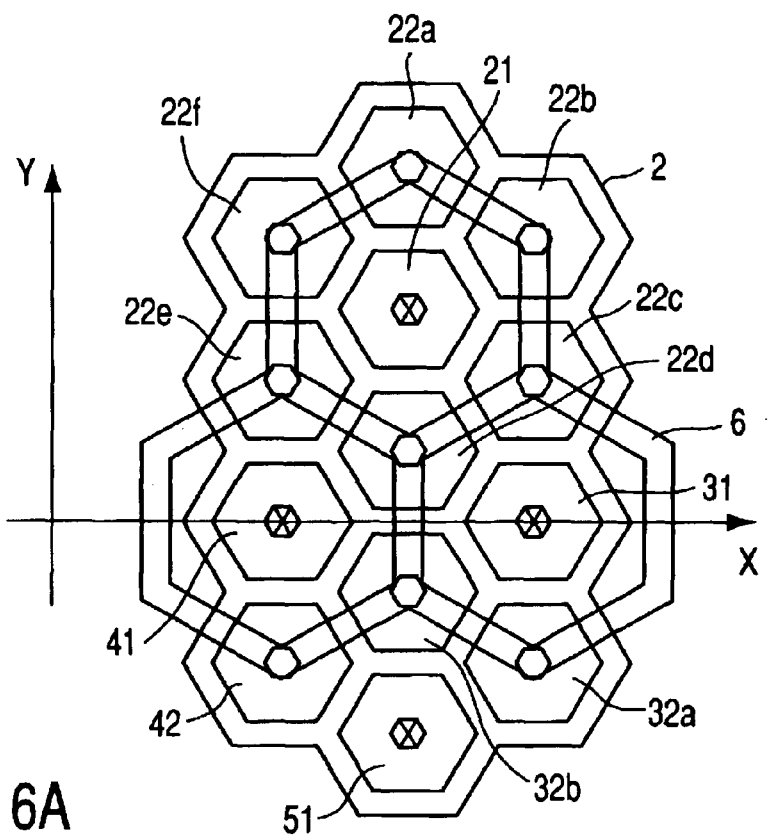
FIGS. 6A and 6B are views showing a schematic configuration of a semiconductor device according to a second embodiment of the present invention.
Figure 6B:
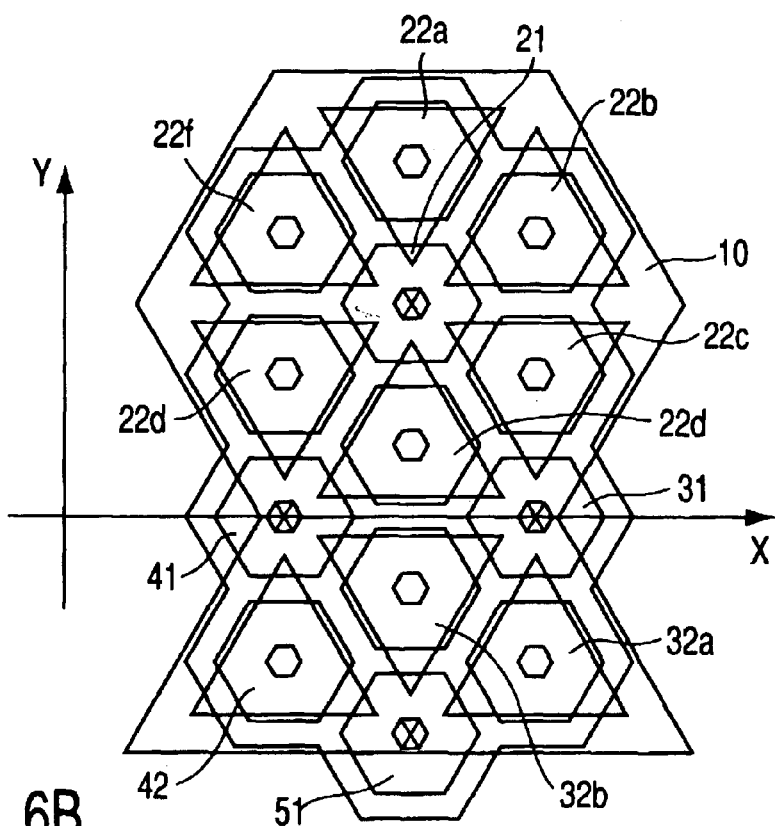

FIGS. 6A and 6B are views showing a schematic configuration of a semiconductor device according to a second embodiment of the present invention. FIG. 6A is a plan view showing a configuration of the gate electrode and the source wiring layer, and FIG. 6B is a plan view showing a configuration of the gate electrode and the drain wiring layer. In FIGS. 6A and 6B, like portions identical to those in FIGS. 1A, 1B, 3, and 4 are denoted with like numerals, and description thereof will be omitted.

As shown in FIG. 6A, the gate electrode 2 where a plurality of equilateral hexagonal rings are mutually connected so as to form a honeycomb structure is configured. Further, the source wiring layer 6 is configured in which a plurality of equilateral hexagonal rings are mutually connected so as to form the honeycomb structure. The equilateral hexagonal ring of the gate electrode 2 and the equilateral hexagonal ring of the source wiring layer 6 are different from each other in size.

The equilateral hexagonal rings constructing the gate electrode 2 are each configured with two segments (hereinafter, referred to as the x direction) parallel to the segment connecting the centers of the adjacent drain diffusion layers 31 and 41, and four segments parallel to the direction inclined 60° towards the x direction. Further, the source wiring layer 6 is configured with two segments (hereinafter, referred to as the y direction) orthogonal to the x direction, and four segments parallel to the direction inclined 30° towards the x direction.

As shown in FIG. 6B, the drain wiring layer 10 connected to the drain via plugs is configured in which a plurality of equilateral triangle rings are mutually connected so as to form the honeycomb structure. One side of the equilateral triangle ring is parallel to the x direction.

When the configuration as the source wiring layer of the semiconductor device according to the present embodiment is employed, the area of the source wiring layer can be further reduced as compared with the semiconductor device according to the first embodiment so that a semiconductor device with excellent high speed/high frequency characteristics can be realized.

As shown in the first embodiment, the gate electrode 2 may be fully covered with the source wiring layer 6.

(Third Embodiment)

Figure 7A:
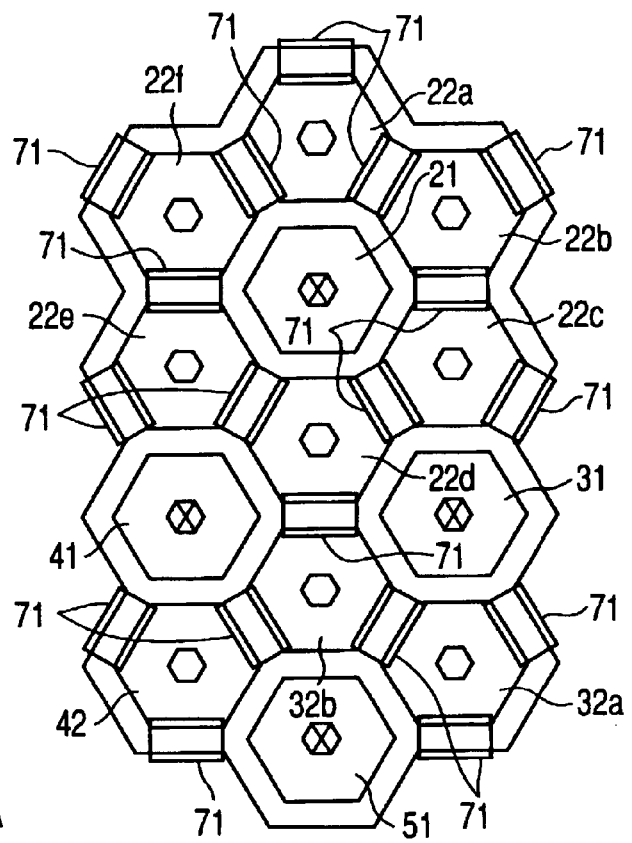
FIGS. 7A and 7B are views showing a schematic configuration of a semiconductor device according to a third embodiment of the present invention.
Figure 7B:
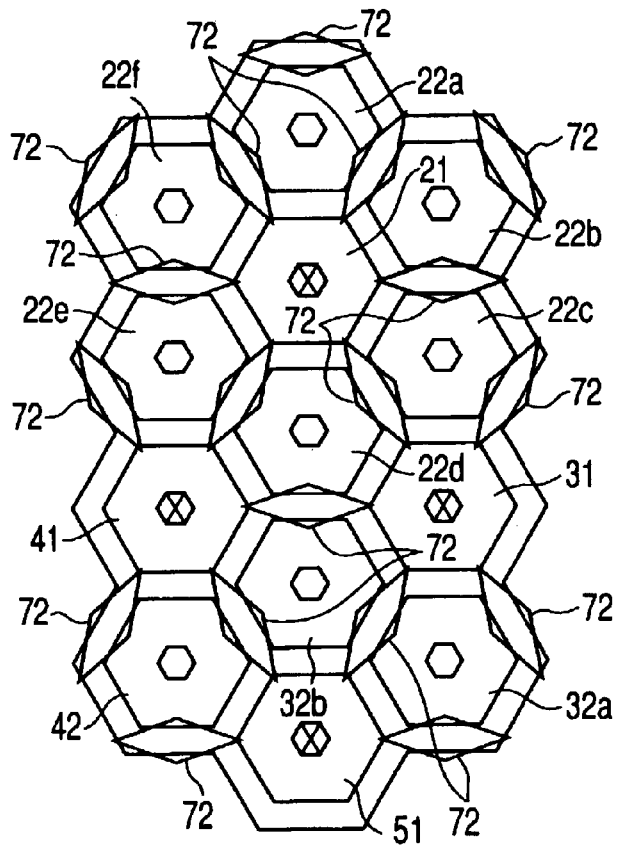

FIGS. 7A and 7B are views showing a schematic configuration of a semiconductor device according to a third embodiment of the present invention. In FIGS. 7A and 7B, like portions identical to those in FIGS. 1A and 1B are denoted with like numerals, and description thereof will be omitted.

As shown in FIGS. 7A and 7B, insulating layers 71 and 72 made of, for example, silicon oxide film are formed between the respective source diffusion layers 22, 32, and 42 of the semiconductor substrate.

The insulating layers are formed between the source diffusion layers so that the gate capacitance, that is the input capacitance is further reduced, thereby improving the high speed/high frequency characteristics.

When the insulating layers 71 and 72 are provided between the respective source diffusion layers 22, 32, and 42, the input gate capacitance can be reduced to half or less, and the gate response speed can be improved to be more than double. When the element is used as a high frequency transistor, the maximum cutoff frequency is determined by the time constant τ=RgCg with the gate resistance Rg and the input gate capacitance Cg. Therefore, the semiconductor device according to the present embodiment is used as a high frequency transistor, and is highly effective for improving the characteristics.

The present invention is not limited to the above embodiments, and can be variously modified and implemented without departing from the gist.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a plurality of unit cells, each comprising a gate insulating film formed on a semiconductor substrate, a gate electrode the gate insulating film and in which a plurality of hexagonal rings are mutually connected so as to form a honeycomb structure, a drain diffusion layer formed in the semiconductor substrate on the inside of one hexagonal ring, and source diffusion layers formed in the semiconductor substrate on the inside of a plurality of hexagonal rings which are adjacent to the hexagonal ring having the drain diffusion layer formed therein;

source contact plugs formed in the semiconductor substrate and are electrically connected to source diffusion layers;

a source wiring layer formed on the semiconductor substrate and is connected to the source contact plugs;

drain contact plugs formed on the semiconductor substrate and are electrically connected to drain diffusion layers; and a drain wiring layer formed on the semiconductor substrate and is electrically connected to the drain contact plugs, wherein each unit cell is arranged sharing source diffusion layers in adjacent unit cells, the hexagonal rings each have two vertexes having an inner angle 90°, and four vertexes having an inner angle 135°, the hexagonal rings each being symmetrical with respect to a segment connecting the two vertexes having an inner angle 90°, and the drain wiring layer being configured in which a plurality of rectangular equilateral triangle rings, where a hypotenuse is parallel to the segment, are mutually connected so as to form a honeycomb structure.

2. A semiconductor device according to claim 1, wherein the source wiring layer is formed so as to cover a gate electrode through a first interlayer insulating film.

3. A semiconductor device according to claim 2, wherein the drain wiring layer is formed on the source wiring layer through a second interlayer insulating film.

4. A semiconductor device according to claim 1, further comprising insulating layers formed between respective source diffusion layers in the semiconductor substrate.

5. A semiconductor device according to claim 1, wherein the length of a side connecting the vertex having an inner angle 90° and the vertex having an inner angle 135° is $\delta$, and the length of a side connecting the vertexes having an inner angle 135° is $\sqrt{2}\delta$.

6. A semiconductor device according to claim 1, wherein the length of a hypotenuse of the rectangular equilateral triangle ring is $3\sqrt{2}\delta$, and the lengths of other two sides are each $3\delta$.

* * * * *